United States Patent
Ono et al.

[19]

[11] Patent Number: 5,888,106
[45] Date of Patent: Mar. 30, 1999

[54] PIN CONTACT AND ELECTRIC PARTS HAVING THE SAME

[75] Inventors: Takayuki Ono; Toshiaki Fujino; Kiyoshi Matsui, all of Hadano; Kenichi Kasai, Ushiku; Morio Suzuki, Hadano, all of Japan

[73] Assignee: Hitachi, Ltd., Tokyo, Japan

[21] Appl. No.: 563,070

[22] Filed: Nov. 27, 1995

[30] Foreign Application Priority Data

Nov. 30, 1994 [JP] Japan .................................. 6-297133

[51] Int. Cl.$^6$ .................................................. H01R 13/04
[52] U.S. Cl. ........................................................... 439/884
[58] Field of Search .............................................. 439/884

[56] References Cited

U.S. PATENT DOCUMENTS

| | | | |
|---|---|---|---|
| 4,090,772 | 5/1978 | Goodman | 439/884 |
| 4,679,890 | 7/1987 | Fineblum | 439/884 |
| 4,983,134 | 1/1991 | Baldyrou | 439/884 |
| 5,083,928 | 1/1992 | Aikens et al. | 439/884 |

FOREIGN PATENT DOCUMENTS 208710  4/1984  German Dem. Rep. .............. 439/884

58-57871  12/1983  Japan .

*Primary Examiner*—Gary Paumen
*Attorney, Agent, or Firm*—Fay, Sharpe, Beall, Fagan, Minnich & McKee

[57] ABSTRACT

A pin contact of a connector includes a parallel portion which touches a contact portion of a contact spring portion of a socket contact when the pin contact is fitted into the socket contact, and an inclined portion to be inserted into the contact spring portion while forcibly opening the contact spring portion at the time of insertion. The inclined portion has a shape which is a combination of a curve portion and a linear portion, the curve portion being moderate in inclination in the area of a boundary point between the curve portion and the parallel portion while sharp in inclination in the area of a contact start point at a pointed end of the contact pin contact. The linear portion has a constant inclination angle. The insertion force of the pin contact increases linearly proportionally to the fitting depth of the pin contact into the socket contact while the linear portion is touching the contact spring portion, whereas the insertion force of the pin contact is kept constant regardless of the fitting depth while the curve portion is touching the contact spring portion of the socket contact at a point over the boundary point between the linear portion and the curve portion.

10 Claims, 5 Drawing Sheets

$$X = -\frac{Y}{\mu} + \left(1 + \frac{1}{\mu^2}\right)\ln\frac{A}{|\mu Y - A|}$$

PIN CONTACT AND ELECTRIC PARTS HAVING THE SAME

BACKGROUND OF THE INVENTION

The present invention relates to a connector constituted by a socket contact and a pin contact or printed-circuit board contact plug portion (hereinafter generically called "pin contact") fitted into a socket contact, and particularly relates to a structure of a pin contact having a low insertion force connection.

A known connector is generally constituted by a socket contact and a pin contact which has an inclined portion to be inserted into the socket contact while forcedly opening a contact spring portion formed in the socket contact, and a parallel portion which touches a contact portion of the contact spring portion when the pin contact is fitted into the socket contact.

FIG. 10 shows a general structure of such a connector. In FIG. 10, a pin contact 102 is fitted into a socket contact 101. The socket contact 101 has at least one contact spring portion 110 disposed at any one of the upper, lower, left and right of the socket contact 101 and uses a portion 101a as a fulcrum, and a contact portion (projection portion) 109 shaped like a circular arc and formed in the neighborhood of the contact spring portion 110. The pin contact 102 has a parallel portion 103, and an inclined portion 108 in which a region from a point 105 in the parallel portion 103 to a top end portion of the pin contact 102 is inclined at a constant angle θ. At the time of insertion, this pin contact 102 is inserted into the socket contact 101 while the contact portion 109 of the socket contact 101 is forcedly opened by the inclined portion 108 at a top end of the pin contact 102. In a fitted state, the parallel portion 103 having a predetermined external diameter touches the contact portion 109. In FIG. 10, the reference character F designates the insertion force of the pin contact 102, and the reference character P designates the elastically restoring force of the contact portion 109.

If a structure as shown in FIG. 10 is used merely as a pin contact structure, the total insertion force of a connector increases correspondingly to the increase of the number of pins in the connector. Because the size and density of electric parts have been increased recently, the number of pins has been further increased. Assuming now that, for example, the insertion force of a connector having one pin contact as shown in FIG. 10 is 100 g, then the total insertion force of a connector having 1,000 pin contacts is 100 kg which is 1,000 times as much as the insertion force of 100 g. The total insertion force of a connector having 10,000 pin contacts would be 1,000 kg. Because the increase of the total insertion force has an influence not only on "difficulty of insertion" but also on the strength and mount space of electric parts to be connected by the connector, this may become a problem in connection with electric appliances. Accordingly, reduction of the insertion force of the connector becomes an important factor.

A structure of a contact plug portion of a printed-circuit board to attain a reduction of the insertion force, is disclosed in JPB-58-57871. As shown in FIG. 11, the structure is designed so that an inclined portion 208 of a contact 202 in a contact plug portion of a printed-circuit board is shaped like a curve represented by the expression:

$$X = -\frac{Y}{\mu} + A\left(1 + \frac{1}{\mu^2}\right) \ln \frac{A}{|\mu Y - A|} \quad (1)$$

in which X is a distance in a direction parallel to a parallel portion 203 by reference (reference point B) to a point (contact point) at which the contact 202 first touches a contact spring portion of a socket contact (not shown) when inserted into the socket contact, Y is a distance in a direction perpendicular to the parallel portion 203 by reference to a point B, ($X_0$ and $Y_0$) are the coordinates of a boundary point between the inclined portion 208 and the parallel portion 203, $\mu$ is a dynamic friction coefficient between the socket contact and the parallel portion 203, and A is a constant determined by $X_0$, $Y_O$ and $\mu$. In the structure of a contact plug portion of a printed-circuit board according to JP-B-58-5787 the inclined portion 208 has a sharp inclination in the area of its pointed end portion and the inclination becomes gentle as the position approaches the parallel portion 203. With By this structure, the insertion force F can be kept constant and the maximum value of the insertion force F can be reduced to about ½ compared with the constant inclined portion 108 shown in FIG. 10. The contact 202 is supported by a fixing mold 214 to thereby form a printed-circuit board contact plug portion.

SUMMARY OF THE INVENTION

The principle of the insertion force of a connector will be described here with reference to FIG. 10. Assuming now that the force for inserting the pin contact 102 (insertion force) is represented by F against the contact force P of the contact spring portion 110 acting on the contact point 109 between the socket contact 101 and the pin contact 102, the contact force P increases correspondingly to the shape of the inclined portion 108 at the pointed end of the pin contact 102 because the opening of the socket contact 101 is widened as the pin contact 102 is inserted into the socket contact 101 more deeply.

On the other hand, the inclination angle θ of the inclined portion 108 at the pointed end of the pin contact 102 has an influence on an effect of forcibly opening the contact portion 109 of the socket contact 101, so that the pin contact is made easier to insert as the inclination angle θ decreases. That is, the insertion force F is expressed as a function of the contact force P (the shape of the inclined portion), the inclination angle θ (differentiation of the shape of the inclined portion) and the friction coefficient $\mu$.

In the case of a pin contact 102 having a constant inclined portion 108 as shown in FIG. 10, the insertion force F is generally expressed in a curve as represented by the thin solid line (I) in FIG. 3. That is, after the boundary point 105 between the inclined portion 108 and the parallel portion 103 in the pin contact 102 has passed through the contact portion 109 of the socket contact 101, only the dynamic friction coefficient and contact force act to form a contact insertion force $F_0$. On the other hand, a peak value $F_{MAX}$ which is several times as large as $F_0$ is generated in a period of from the start of insertion of the pin contact 102 to the achievement of the constant insertion force $F_0$. This phenomenon is caused by the fact that the insertion force decreases as the inclination angle θ changes rapidly to a small value in the neighborhood of the boundary point between the inclined portion and the parallel portion even in the case where the shape of the inclined portion of the pin contact has the inclination of a constant angle.

As described above, an insertion force which is several times as large as $F_0$ is required for inserting the pin contact 102 having the constant inclined portion 108, as shown in FIG. 10, into the socket contact 101. Further, the total insertion force increases proportionally to the increase of the number of pins. This has an influence on design of the structure (disruptive strength) of a substrate, or the like, to which the socket contact and the pin contact are connected.

In FIG. 3, the thick dotted line (III) shows an insertion force curve of a connector having a curve shown in FIG. 11 and given by the aforementioned expression (1). This insertion force curve (III) has no peak value unlike the insertion force curve (I) which has a peak value as shown in FIG. 3. From the insertion force curve (III), it is apparent that an ideal constant insertion force is obtained. The insertion force, however, exhibits a peak value when the pin contact begins to be fitted into the socket contact. This is because the contact angle θ of a point (reference point B in FIG. 11) at which the pin contact first touches the contact portion of the socket contact is near 90°. Accordingly, there arises a defect in that easiness of insertion is spoiled because of the position accuracy and tolerance of the socket contact or pin contact. As a result, it is necessary to set the width (width 112 in FIG. 10) of the socket contact to a large value to make the pin contact fit thereinto. This measure, however, brings about an increase of the size of the contact and a reduction of mounting density in the printed-circuit board contact plug portion. As described above, the requirement of an inclined portion of the pin contact cannot be satisfied by the curve represented by the aforementioned expression (1).

An object of the present invention is therefore to provide a contact structure for a connector in which the insertion force can be reduced in spite of its simple structure and which is easy to insert.

Another object of the present invention is to provide an electric part having contacts in which insertion force can be reduced in spite of its simple structure and which is easy to insert.

The foregoing objects are achieved by a pin contact to be fitted into a socket contact having a contact spring portion, the pin contact comprising an inclined portion to be inserted into the contact spring portion while forcibly opening the contact spring portion, and a parallel portion which touches the contact spring portion when the pin is fitted into the socket contact, wherein the inclined portion includes a curve portion formed so as to be continued from the parallel portion, and a linear portion formed in a range from the curve portion to a pointed end of the pin contact so as to be continued from the curve portion. Further, the curve portion is formed of a curve represented by an expression $$X = -\frac{Y}{\mu} + A\left(1 + \frac{1}{\mu^2}\right) \ln \frac{A}{|\mu Y - A|}$$

in which X is a distance in a direction parallel to the parallel portion by reference to a point at which the contact pin first touches the contact spring portion, Y is a distance in a direction perpendicular to the parallel portion by reference to the point, $\mu$ is a dynamic friction coefficient between the contact spring portion and the parallel portion, and A is a constant. Further, the linear portion is formed by replacing a region where $\theta_0 < dx/dy$ is satisfied in the curve by a line which has an arbitrary constant inclination angle $\theta_0$ with respect to the X axis taken in a direction parallel to the parallel portion and which is extended up to a center of the pin contact.

In general pin contact, it has been mainly considered to design the shape of the pointed end portion to have a constant inclination angle θ as shown in FIG. 10, the inclination changes rapidly at the boundary point between the inclined portion and the parallel portion, so that the degree of the insertion force is shaped like a mountain as represented by the insertion force curve (I) shown in FIG. 3. Accordingly, if the change of the inclination is made gentle in the neighborhood of the boundary point and sharp in the neighborhood of the contact start point (reference point B), the insertion force can be kept constant.

According to the present invention, because the sectional shape of the inclined portion of the pin contact is designed on the basis of the aforementioned expression so that the inclination becomes sharper in the neighborhood of the pointed end and becomes less in the neighborhood of the parallel portion, the insertion force is kept constant regardless of the fitting depth of the pin contact. Furthermore, in the neighborhood of a point at which the inclined portion first touches the socket contact, the inclined portion may be formed to be a line having a constant inclination angle $\theta_0$ to make it easy to insert the pin contact in the same manner as the general pin contact, by which a low-insertion-force connector can be provided.

DESCRIPTION OF THE PREFERRED EMBODIMENT

An embodiment of the present invention will be described below with reference to the drawings.

Figure 1:
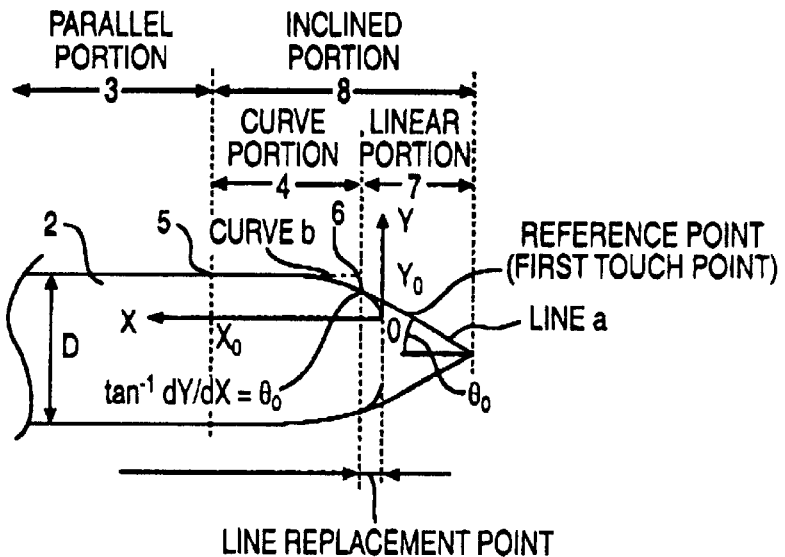
FIG. 1 is a view showing a pin contact of an embodiment of the present invention.
Figure 2:
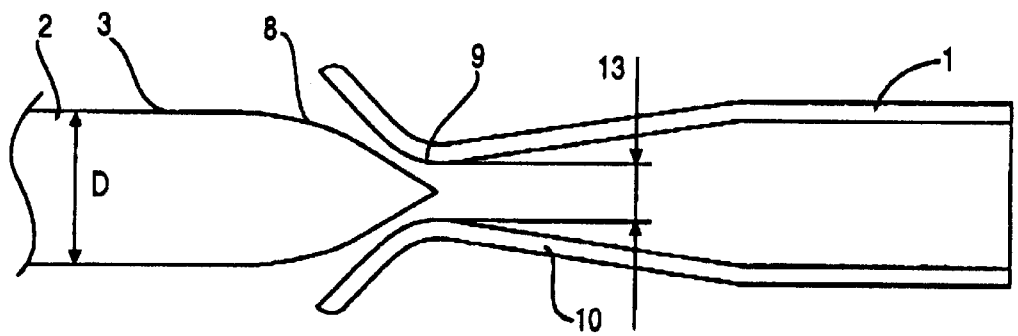
FIG. 2 is a view showing a connector having a socket contact and a pin contact of an embodiment of the present invention.

FIG. 1 is an enlarged view of a pointed end portion of a pin contact as an embodiment of the present invention. FIG. 2 is a view showing the structure of a connector using the pin contact in this embodiment. In FIGS. 1 and 2, the pin contact 2 comprises a parallel portion 3 of a predetermined external diameter D which touches a contact portion (projection portion) 9 of a contact spring portion 10 of a socket contact 1 when the pin contact 2 has been fitted into the socket contact 1, and an inclined portion 8 to be inserted into the contact spring portion 10 while forcibly opening the contact spring portion 10 at the time of insertion. Further, the inclined portion 8 includes a curve portion 4, and a linear portion 7. The body of the contact pin 2 has a symmetrical transverse cross section whereby the inclined portion 8 has a symmetrical transverse cross section throughout its length.

The curve portion 4 is formed of a curve b represented by the expression $$X = -\frac{Y}{\mu} + A\left(1 + \frac{1}{\mu^2}\right) \ln \frac{A}{|\mu Y - A|} \tag{1}$$

in which, with reference to a point (reference point B) at which the contact pin first touches the contact portion 9 of the contact spring portion 10 of the socket contact 1 at the time of insertion, X is a distance from the reference point B in a direction parallel to the parallel portion 3, Y is a distance from the reference point B in a direction perpendicular to the parallel portion 3, $(X_0, Y_0)$ are the coordinates of a boundary point 5 between the inclined portion 8 and the parallel portion 3, $\mu$ is a dynamic friction coefficient between the contact portion 9 and the parallel portion 3, and A is a constant determined by the values of $X_0$, $Y_0$ and $\mu$.

The linear portion 7 is formed by replacing a region in which $\theta_0 < dx/dy$ is satisfied in the curve (X, Y, dX/dY) by a line a which has an arbitrary constant inclination angle $\theta_0$ assumed with respect to the X axis and which is extended up to the center line ($Y_0$-D/2) of the pin contact. Point 6 is a boundary point between the curve portion 4 and the linear portion 7 where $dX/dY = \theta_0$ is established.

This embodiment will be described further with reference to FIG. 4.

Figure 4:
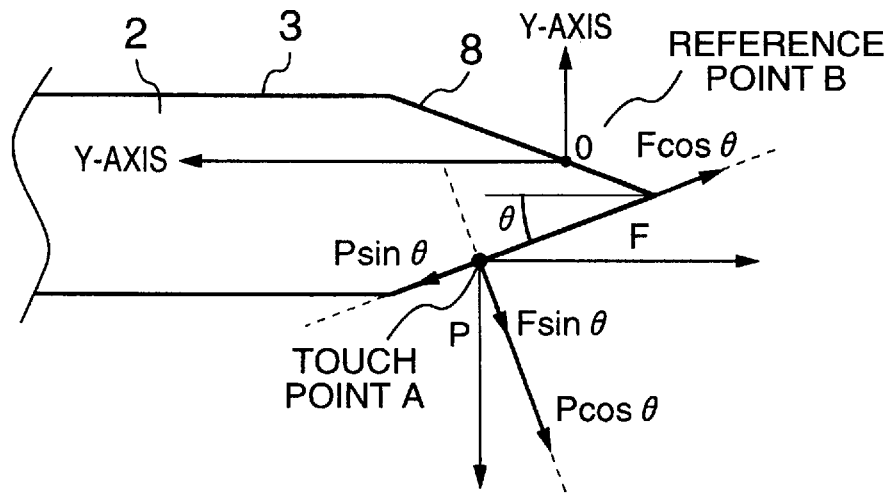
FIG. 4 is a view showing force balance in the pin contact for explaining the principle of the present invention.

FIG. 4 is a view for explaining the principle of the present invention. Assume first that the insertion force is formulated by using FIG. 4 in the case where the contact point is infinitely small. Assume now that the pin contact 2 touches the socket contact 1 at a contact point A. In order to consider the balance of force at this contact point A, partial forces in a tangential direction and a normal direction of the inclined portion 8 are considered and an equation is formed as follows.

$$F \cos \theta - nP \sin \theta = \mu(nP \cos \theta + F \sin \theta)$$

in which n is the number of contact points, F is the insertion force of the pin the contact 2, P is contact force given from the socket contact 1, and $\theta$ is the inclination angle of the inclined portion 8 at the pointed end portion of the pin contact.

The insertion force can be represented by the following expression.

$$F = \frac{\mu + \tan\theta}{1 - \mu\tan\theta} \cdot n \cdot P \tag{2}$$

Further, when X and Y are defined as explained in FIG. 1 by reference to the position (reference point B) where the contact portion of the contact spring portion of the socket contact first touches the inclined portion 8 of the pin contact 2, the following expression is obtained.

$$P = KY \tag{3}$$

where K is the spring constant of the contact spring portion of the socket contact.

Because tan $\theta$ can be expressed as dY/dX, the expression (2) is rearranged as follows.

$$F = \frac{\mu + dY/dX}{1 - \mu dY/dX} \cdot n \cdot K \cdot Y \tag{4}$$

Because the maximum peak value of the insertion force F can be made low if the insertion force F in the expression (4) is made constant, the following expression is obtained.

$$\frac{\mu + dY/dX}{1 - \mu dY/dX} \cdot n \cdot K \cdot Y = C \tag{5}$$

Because the expression (5) is a differential equation of Y with respect to X, the solution of X is obtained as follows.

$$X = -\frac{Y}{\mu} + A\left(1 + \frac{1}{\mu^2}\right) \ln \frac{A}{|\mu Y - A|} \tag{6}$$

That is, this is the expression (1). A is a constant determined by $X_0$, $Y_0$ and $\mu$ as follows.

$$X_0 = -\frac{Y_0}{\mu} + A\left(1 + \frac{1}{\mu^2}\right) \ln \frac{A}{|\mu Y_0 - A|} \tag{7}$$

On the other hand, the inclination dY/dX of the curve represented by the expression (6) (that is, the expression (1)) is given as follows by differentiating the expression (6).

$$dY/dX = 1/(dX/dY) = 1/\left\{-\frac{1}{\mu} - A\left(1 + \frac{1}{\mu^2}\right)\frac{\mu}{\mu Y - A}\right\} \tag{8}$$

Accordingly, as shown in FIG. 1, the curve b(x, Y) in a range of from the reference point B to the boundary point 5 between the inclined portion 8 and the parallel portion 3 is obtained from the expression (6) by using A which is obtained by the expression (7). The outer curve of the sectional shape of the inclined portion 8 is formed by replacing a region where $\theta_0 < dX/dY$ is satisfied in the curve b(X, Y, $\mu$, dY/dX) by a line a which is inclined at an arbitrary constant inclination angle $\theta_0$ (by reference to the X axis) and which is extended up to the center line ($Y_0$-D/2) of the pin contact. That is, the inclined portion 8 in the pointed end portion of the pin contact in FIG. 1 is shaped by using a combination of a line a (arbitrary line) in a range of from the center line of the pin contact to a position where the inclination if $\theta_0 < dX/dY$ and a curve b (expression (6)) in a range of from the position where the inclination is $\theta_0 < dX/dY$ to the boundary point between the inclined portion and the parallel portion.

The pointed end portion which is in the front of the portion which first touches the contact portion of the socket contact on the line a can be shaped arbitrarily so long as it does not disturb fitting.

Figure 3:
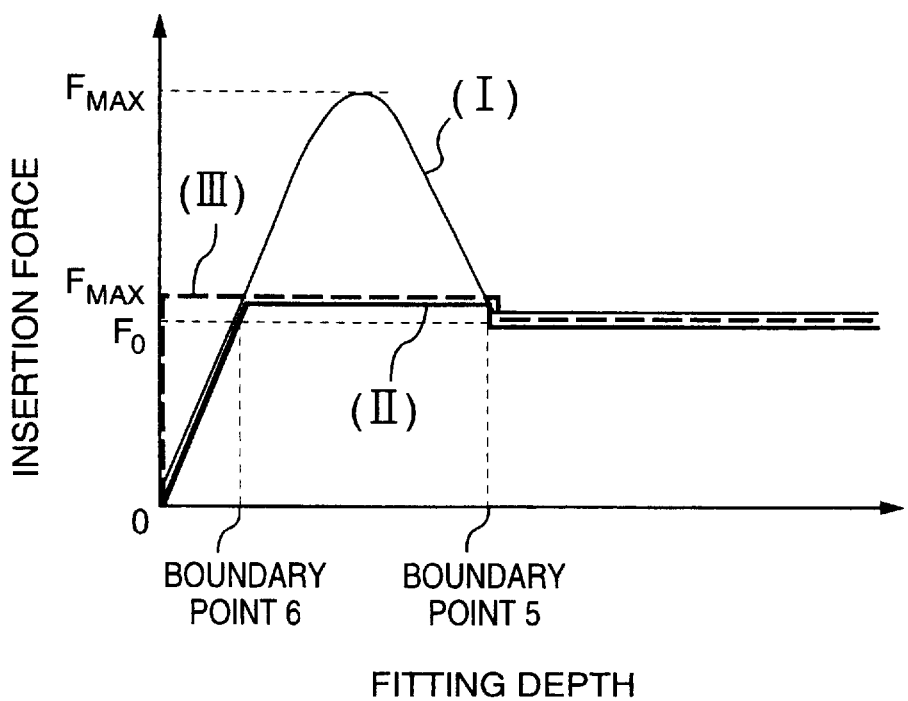
FIG. 3 is a graph showing the relation between insertion force and fitting depth for the purpose of comparing a pin contact according to an embodiment of the present invention with a conventional pin contact.

In the case where the pin contact 2 in this embodiment is used, the insertion force F changes as represented by the thick dotted line (III) in FIG. 3, that is, the insertion force F increases linearly proportionally to the fitting depth of the pin contact while the linear portion 7 is touching the contact portion of the socket contact whereas the insertion force F is kept constant regardless of the fitting depth of the pin contact when the contact point between the pin contact and the contact portion of the socket contact moves over the boundary point 6 to the curve portion 4. Accordingly, such a large peak insertion force represented by the insertion force curve (I) in FIG. 3 as required conventionally is not required, so that the connector can be fitted easily by the minimum insertion force without addition of any complex structure while the contact force is maintained in the same manner as in the conventional contact force.

In the case where the pin contact of this embodiment is used, any shape of the socket contact, for example, as shown in FIG. 2 can be used, so that there can be obtained an effect that the insertion force F for the arbitrary shape of the socket contact is kept constant in the same manner as described above.

When, for example, in an experiment, the spring proportional constant K of the socket contact, the friction coefficient $\mu$ thereof, the diameter of the pin contact and the constant inclination angle $\theta_0$ thereof were selected to be K=0.3 kg/mm (normally 0<K<1.0), $\mu$=0.2 (normally 0.1<$\mu$<1), 0.3 and $\theta_0$=30°, the insertion force F increased linearly proportionally to the fitting depth of the pin contact as shown in FIG. 3 until the contact point had reached the position (boundary point 6) where the inclination is dX/dY= 30°.

The inclination of the line depends on the inclination angle $\theta_0$ of the pointed end of the pin contact, so that it is apparent that the inclination becomes more gentle as the angle $\theta_0$ decreases.

It has been confirmed that the insertion force F exhibits a predetermined value of about 15 g when the contact point between the pin contact and the contact portion of the socket contact moves to the curve b represented by the expression (6) (boundary point 5), and the insertion force F exhibits about 10 g when the contact point has reached the parallel portion 3. Accordingly, it is apparent that the maximum value of a series of insertion forces F is about 15 g represented by the curve b.

Figure 10:
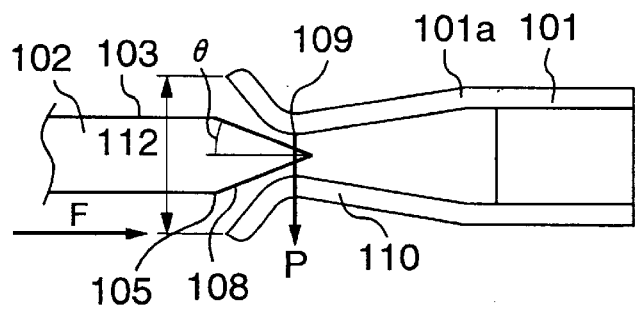
FIG. 10 is a view showing a general connector having a socket contact and a pin contact.
Figure 11:
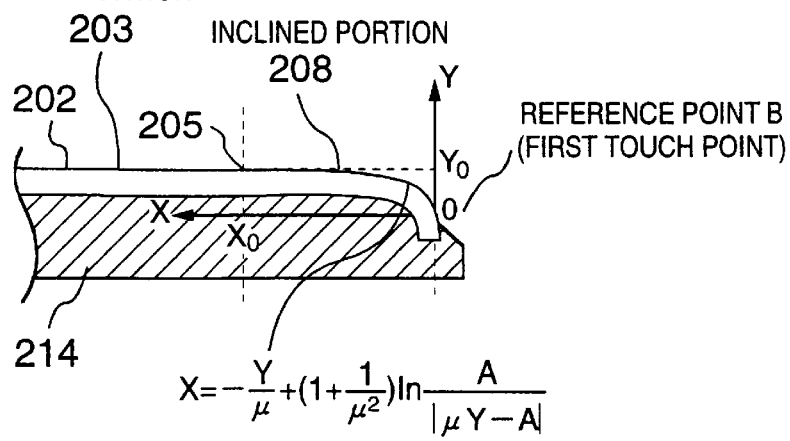
FIG. 11 is a view showing a printed-circuit board contact plug portion having an inclined portion shaped like a curve.

On the other hand, when a conventional pin contact having an inclined portion at a constant inclination angle $\theta$=30° on the whole as shown in FIG. 10 is used, the insertion force of the parallel portion does not change but the maximum value of the insertion force exhibits about 30 g. That is, it can be confirmed that the insertion force F in the case where the pin contact 2 in this embodiment is used can be reduced to about ½ of the insertion force in the case where the conventional pin contact is used.

When the curve b in FIG. 1 is obtained by solving the expression (6), the way of setting the coordinates ($X_0$, $Y_0$) in a range of from the reference point B to the boundary point 5 at this time is made important.

First, the way of setting $Y_0$ will be described. This value is determined on the basis of the contact gap 13 and the pin diameter D shown in FIG. 2 and expresses the quantity of displacement of the contact spring portion 10 of the socket contact 1. First, the contact gap 13 of the socket contact 1 is set. When the reference point B in the pin contact 2 then is set correspondingly to the thus set contact gap 13, the insertion force F of the pin contact 2 into the socket contact having the thus set contact gap 13 (set value) is kept constant as represented by the insertion force curve (II) in FIG. 3.

Figure 5:
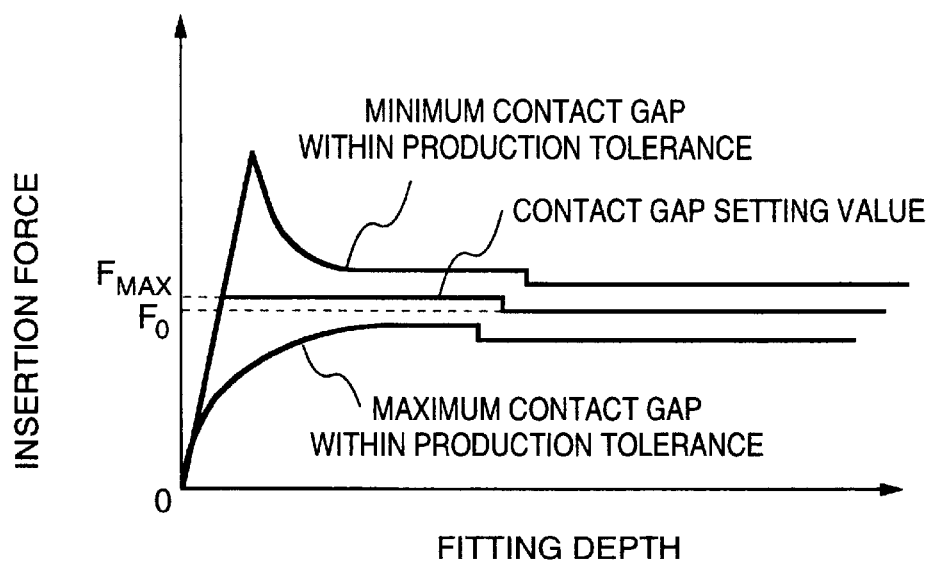
FIG. 5 is a graph showing the influence of the production tolerance in a contact gap of the socket contact with respect to the relation between the insertion force of the pin contact and the fitting depth thereof in an embodiment of the present invention.

FIG. 5 shows the relation between the connector fitting depth and the insertion force F in the case where the production tolerance with respect to the set value of the contact gap 13 is considered. As shown in FIG. 5, the insertion force F has a tendency to increase for a socket contact 1 having the minimum contact gap 13 within a range of production tolerance for the set value of the contact gap 13. Accordingly, at the time of calculation of the curve b of the pin contact 2, it is necessary that the Y-direction value of the reference point B is set to be in the minimum value of production tolerance of the contact gap 13 of the socket contact 1. That is, the Y-direction value of the reference point B is set as follows.

$Y_0 = D/2 - (\text{minimum contact gap})/2$ where D is the pin diameter of the pin contact.

Figure 6:
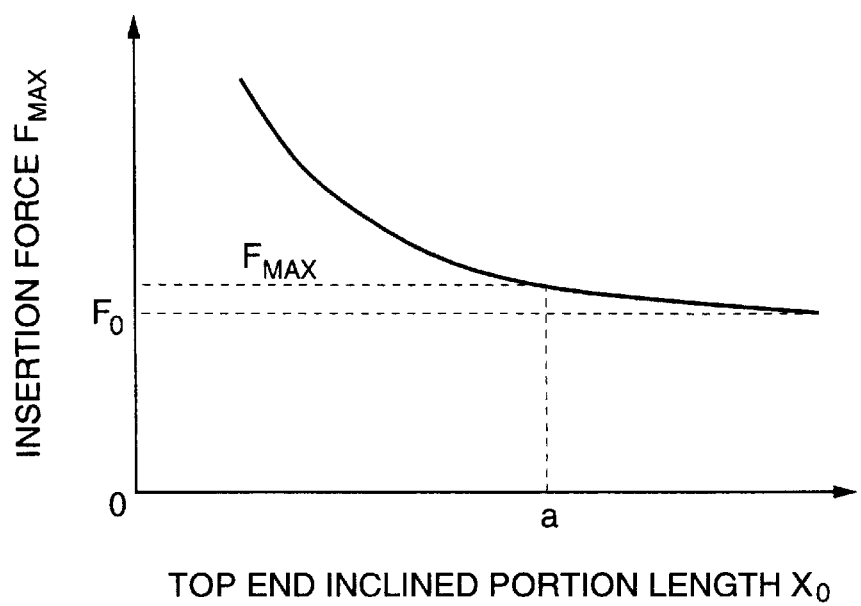
FIG. 6 is a graph showing the relation between the insertion force of the pin contact and the length of the inclined portion of the pin contact in an embodiment of the present invention.

Next, the way of setting $X_0$ will be described. $X_0$ is a value from the reference point B which has a direct influence on the length of the inclined portion 8 in the pointed end portion of the pin contact 2. FIG. 6 shows the relation between $X_0$ and the maximum value $F_{MAX}$ of the insertion force F. The maximum value of the insertion force F depends on the length of the inclined portion 8 in the pointed end portion of the pin contact 2. Accordingly, it is found that the maximum value of the insertion force F gradually approaches insertion force $F_0$ in the parallel portion 3 of the pin contact 2 as the length of the pointed end portion increases. Accordingly, it is effective that the length of the pointed end portion of the pin contact 2 is set to be large in order to reduce the insertion force, but the range of length allowed to be used as the inclined portion 8 in the pointed end portion is generally limited because the length of the pin contact 2 is limited by the whole length and the fitting depth of the connector. It is therefore apparent that the maximum value $X_0$ is preferably set to be within a range allowed to be used as the inclined portion 8 in the pointed end portion of the pin contact 2 and upon the consideration of the length of a finally formed line inclined at an arbitrary constant inclination angle $\theta$. In the aforementioned experiment, the value of $X_0$ in FIG. 6 was selected to be in a range of from 0.5 to 0.7.

Figure 7:
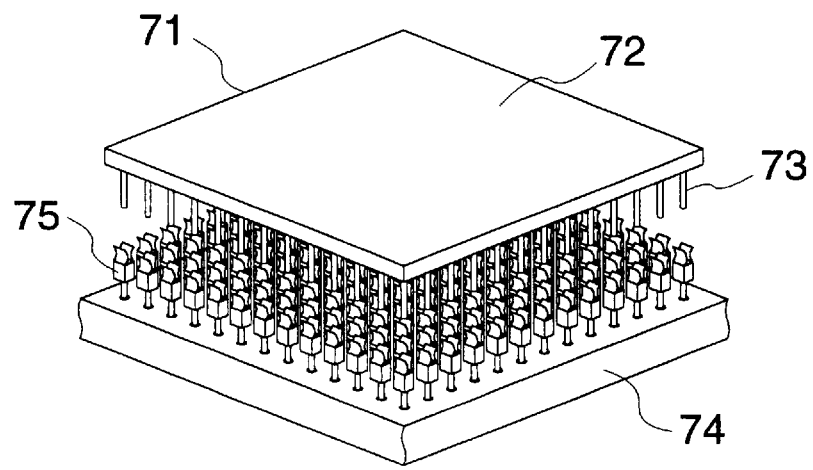
FIG. 7 is a view showing an electric part having pin contacts in an embodiment of the present invention and a main substrate on which the electric part is mounted.

FIG. 7 is a view showing an example in which pin contacts in the aforementioned embodiment are applied as input/output pins for a pin grid array (PGA) LSI socket, a multi-chip module (MCM) substrate, etc. (hereinafter generically called electric parts).

In FIG. 7, an electric part 71 comprises a substrate portion 72, and a large number of pin contacts 73 as input/output pins. This large number of pin contacts 73 are arranged on the lower surface of the substrate portion 72. Further, each of the pin contacts 73 has the same shape as the pin contact 2 shown in FIG. 1.

When, for example, the electric part 71 is a PGA-LSI socket, one PGA-LSI package is mounted on the upper surface of the substrate portion 72 through a plurality of contacts formed on the upper surface of the substrate portion 72. Alternatively, when the electric part 71 is an MCM substrate, at least one LSI package is mounted on the upper surface of the substrate porion 72, for example, by soldering. Of course, a plurality of PGA-LSI packages may be mounted.

A large number of socket contacts 75 are arranged on the upper surface of a main substrate 74 so as to correspond to the large number of pin contacts 73 in the electric part 71.

Figure 8:
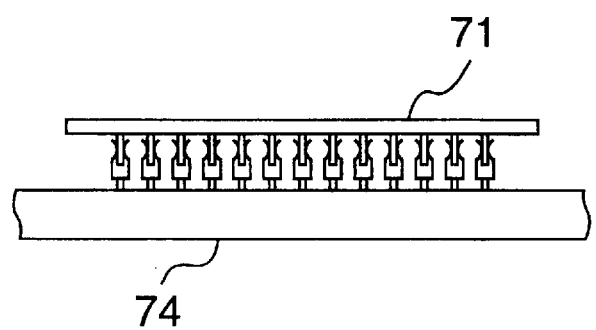
FIG. 8 is a view showing a state where the electric part is mounted on the main substrate.

As shown in FIG. 8, the large number of pin contacts 73 in the electric part 71 are respectively fitted into the large number of socket contacts 75 on the main substrate 74, so that the electric part 71 is mounted on the main substrate 74.

Assuming now that the electric part 71 is a PGA-LSI socket, the electric part 71 has pin contacts of the number corresponding to the purpose of use thereof, for example, 70 to 200 pin contacts. Assuming contrariwise that the electric part 71 is an MCM substrate, the number of pin contacts possessed by the electric part 71 reaches a range from 1,000 to 10,000 correspondingly to the scale thereof.

Consider now the total insertion force which is necessary for the whole of the electric part when such an electric part 71 is mounted on the main substrate 74 as shown in FIG. 8. For example, calculation is made by applying respective values (spring proportional constant of the socket contact, diameter of the pin contact, etc.) used in the aforementioned experiment, to the pin contacts 73 and the socket contacts 75. In the case where the conventional pin contact shown in FIG. 10 is used, the PGA-LSI socket requires a total insertion force as follows:

30 g (maximum insertion force per pin)×200 (maximum number of pins)=6 kg maximum Similarly a MCM substrate requires the total insertion force as follows:

30 g (maximum insertion force per pin)×10,000 (maximum number of pins)=300 kg maximum On the contrary, in the case where the pin contact according to the present invention is used, the PGA-LSI socket merely requires a total insertion force as follows:

15 g (maximum insertion force per pin)×200 (maximum number of pins)=3 kg maximum Similarly the MCM substrate merely requires a total insertion force as follows:

15 g (maximum insertion force per pin)×10,000 (maximum number of pins)=150 kg maximum Because the force acting on the substrate portion 72 of the electric part 71 is reduced in this manner compared with the case where the conventional pin contact is used, accidents by which the electric part 71 is destroyed when the electric part 71 is mounted on the main substrate 74 can be sufficiently prevented from occurring, so that the reliability of the electric part 71 can be improved. In addition, because the total insertion force necessary for the electric part 71 is small, a further increase of the size and density of the electric part 71 can be attained while reliability is maintained.

Another embodiment of the present invention will be described below.

In the previous embodiment, in order to reduce the insertion force of the connector, the pointed end portion of the pin contact is formed of a curve b represented by the aforementioned expression (1) and a line a which is inclined at a constant inclination angle $\theta_0$. Because the forces (the insertion force F and the contact force P) generated at a contact point between a pin contact and a socket contact are however, common to the two contacts at the time of insertion, it is possible to reduce the insertion force by making the insertion force constant by the design of the socket contact.

An example for realizing reduction of the insertion force on the socket contact side will be described with respect to another embodiment.

Figure 9:
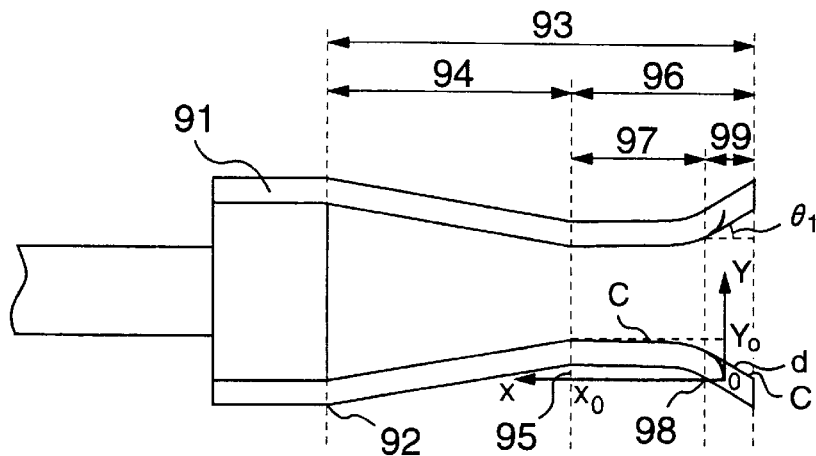
FIG. 9 is a view showing a socket contact of an embodiment of the present invention.

FIG. 9 is a view showing a socket contact in this other embodiment.

In FIG. 9, a socket contact 91 has two contact spring portions 93 which are symmetric with respect to a horizontal line and pivoted on portions 92 as fulcra, respectively. Each of the contact spring portions 93 has a spring portion 94, and a contact portion 96 which touches the inclined portion of the pin contact when the pin contact has been inserted in the socket contact and which touches the parallel portion of the pin contact when the pin contact has fitted in the socket contact. Further, the contact portion 96 has a curve portion 97, and a linear portion 99.

The curve portion 97 is formed of a curve c represented by the aforementioned expression (1) in which, with reference to a point (reference point C) at which the pin contact first touches the inclined portion at the time of insertion, X is a distance from the reference point C in a direction parallel to the center line of the socket contact, Y is a distance from the reference point C in a direction perpendicular to the center line of the socket contact, $(X_1, and Y_1$ are the coordinates of a boundary point 95 between the contact portion 96 and the spring portion 94, $\mu$ is a dynamic friction coefficient between the contact portion 96 and the parallel portion of the pin contact, and A' is a constant determined by $X_1, Y_1$ and $\mu$.

Further, the linear portion 99 is formed by replacing a region where $\theta_1 < dX/dY$ is satisfied in the curve (X, Y, dX/dY) by a line d which has an arbitrary constant inclination angle $\theta_1$ with respect to the X axis and which is extended up to an appropriate length. A point 98 is a boundary point which is between the curve portion 97 and the linear portion 99 and on which the inclination is $dX/dY = \theta_1$.

When the socket contact 91 in this embodiment is used, the insertion force F is changed as represented by the thick solid line (II) in FIG. 3 in the same manner as in the aforementioned embodiment, that is, the insertion force F increases linearly proportionally to the fitting depth of the pin contact while the inclined portion of the pin contact is touching the linear portion 99, whereas the insertion force F is kept constant regardless of the fitting depth of the pin contact when the contact point between the inclined portion of the pin contact and the linear portion 99 moves over the boundary point 98 to the curve portion 97. Accordingly, even in the case where the socket contact 91 in this embodiment is used, such a large peak insertion force represented by the insertion force curve (I) in FIG. 3 as required conventionally is not required, so that the connector can be fitted easily with minimum insertion force while the contact force is maintained in the same manner as in the conventional contact force.

In the case where the socket contact in this embodiment is used, any shape of the pin contact may be used, so that it is possible to obtain an effect that the insertion force F for such an arbitrary shape of the pin contact is kept constant in the same manner as described above.

Although embodiments of a connector (pin contact and socket contact) according to the present invention have been above described specifically, the present invention is not limited to the aforementioned embodiments but various changes or modifications may be made without departing from the spirit of the invention.

For example, although the embodiments show examples of the shape of the pin contact or socket contact in which the insertion force is kept constant, the shape of the pin contact and the shape of the socket contact may be used in combination so that the insertion force is kept constant as a synergistic effect of the two contacts.

Although the embodiments show a pin contact and a socket contact into which the pin contact is fitted, the present invention can be applied to any pin shape and any socket shape of a connector so long as the connector has two members fitted to each other.

Further, although the embodiments have shown a PGA-LSI socket and an MCM substrate as electric parts, any material such as a printed-circuit board having a contact plug portion, or the like, may be used if the material has contact portions (pin contacts and other contacts).

As described above, according to the present invention, the following effects are attained.

(1) By replacing only a pin contact or socket contact in a conventional connector structure by a new one, insertion force can be approximately halved compared with the conventional connector.

(2) Because the insertion force of the connector can be approximately halved, force acting on electric parts is reduced so that accidents such as destruction of electric parts, etc. can be sufficiently prevented from occuring and reliability can be improved. Furthermore, the increase of the size and density of electric parts can be attained while reliability is maintained, in the same simple structure as in the conventional connector without addition of any special complex structure and without any structural change which lowers the mounting density. For example, the number of pins can also be increased by twice in spite of the same total insertion force as that of the conventional electric parts.

(3) Because a sharp-angled pointed end equivalent to that of a conventional pin contact can be secured, the influence of tolerance and relative position displacement of the socket contact and pin contact can be sufficiently eliminated so that easiness of insertion equivalent to that of a conventional connector can be secured.

What is claimed is:

1. A pin contact to be fitted into a socket contact having a contact spring portion, said pin contact comprising a body having a symmetrical transverse cross section;

said body including an inclined portion to be inserted into said contact spring portion while forcibly opening said contact spring portion, and a parallel portion which touches said contact spring portion when said pin is fitted into said socket contact;

said inclined portion having a symmetrical transverse cross section throughout its length ad including a curve portion formed so as to be continued from said parallel portion, and a linear portion extending from said curve portion to a pointed end of said pin contact so as to be continued from said curve portion;

said curve portion being formed of a curve which is moderate in inclination in an area of a boundary point between said curve portion and said parallel portion and sharper in inclination in an area of a point at which said curve portion first touches said contact spring portion;

said linear portion being formed of a straight line inclined at an arbitrary constant inclination angle; and wherein an insertion force of said pin contact increases linearly proportionally to a fitting depth of said pin contact into said socket contact while said linear portion is touching said contact spring portion; and the insertion force of said pin contact is kept constant regardless of the fitting depth while said curve portion is touching said contact spring portion at a point beyond a boundary point between maid linear portion and said curve portion.

2. A pin contact to be fitted into a socket contact having a contact spring portion, said pin contact comprising a body having a symmetrical transverse cross section;

said body including an inclined portion to be inserted into said contact spring portion while forcibly opening said contact spring portion, and a parallel portion which touches said contact spring portion when said pin is fitted into said socket contact;

said inclined portion having a symmetrical transverse cross section throughout its length and including a curve portion formed so an to be continued from said parallel portion, and a straight linear portion extending from said curve portion to a pointed end of said pin contact so as to be continued from said curve portion; and wherein said curve portion is formed of a curve represented by an expression $$X = -\frac{Y}{\mu} + A\left(1 + \frac{1}{\mu^2}\right) \ln \frac{A}{|\mu Y - A|}$$

in which X is a distance in a direction parallel to said parallel portion by reference to a point at which said contact pin first touches said contact spring portion, Y is a distance in a direction perpendicular to said parallel portion by reference to said point, A is a dynamic friction coefficient between said contact spring portion and said parallel portion, and A is a constant.

3. A pin contact according to claim 2, wherein said linear portion is formed by replacing a region where $\theta_0 < dX/dY$ is satisfied in said curve by a line which has an arbitrary constant inclination angle $\theta_0$ with respect to a X axis taken in a direction parallel to said parallel portion and which is extended up to a center of said pin contact.

4. A pin contact according to claim 2, wherein said constant A is a constant obtained by an expression $$X_0 = -\frac{Y_0}{\mu} + A\left(1 + \frac{1}{\mu^2}\right) \ln \frac{A}{|\mu Y_0 - A|}$$

in which the coordinates of a boundary point between said curve portion and said parallel portion are represented by $(X_0, Y_0)$.

5. A pin contact according to claim 4, wherein the coordinate value $Y_0$ of said boundary point is set by an expression $Y_0$=(external diameter of the parallel portion)/2−(minimum value of a contact gap)/2 using the external diameter of said parallel portion and the minimum value within a range of production tolerance of a contact gap of said socket contact.

6. A connector comprising a pin contact, and a socket contact into which said pin contact is fitted;

said socket contact including a contact spring portion;

said pin contact comprising a body having a symmetrical transverse cross section;

said body including an inclined portion to be inserted into said contact spring portion while forcibly opening said contact spring portion, and a parallel portion which touches said contact spring portion when said pin contact is fitted into said socket contact;

said inclined portion having a symmetrical transverse cross section throughout its length and having a first curve portion formed so as to be continued from said parallel portion, and a first straight linear portion extending from said first curve portion to a pointed end of said pin contact so as to be continued from said first curve portion; and wherein said first curve portion is formed of a curve represented by an expression $$X = -\frac{Y}{\mu} + A\left(1 + \frac{1}{\mu^2}\right) \ln \frac{A}{|\mu Y_0 - A|}$$

in which X is a distance in a direction parallel to said parallel portion by reference to a point at which said contact pin first touches said contact spring portion, Y is a distance in a direction perpendicular to said parallel portion by reference to said point, $\mu$ is a dynamic friction coefficient between said contact spring portion and said parallel portion, and A is a constant.

7. A connector according to claim 6, wherein said first linear portion is formed by replacing a region where $\theta_0 < dx/dY$ is satisfied in said curve by a line which has an arbitrary constant inclination angle $\theta_0$ with respect to X axis taken in a direction parallel to said parallel portion and which is extended up to a center of said pin contact.

8. An electric part comprising a substrate portion for mounting at least one LSI on an upper surface thereof, and a large number of pin contacts arranged on a lower surface of said substrate portion;

said electric part being mounted on a main substrate having a large number of socket contacts provided correspondingly to said large number of pin contacts and equipped with contact spring portions, respectively, so that said large number of pin contacts are fitted into said large number of socket contacts respectively;

each of said pin contacts comprising a body having a symmetrical transverse cross section, said body including an inclined portion to be inserted into the contact spring portion of a corresponding one of said socket contacts while forcibly opening said contact spring portion, and a parallel portion which touches said contact spring portion when said pin contact is fitted into said corresponding one socket contact;

said inclined portion having a symmetrical transverse cross section throughout its length and having a curve portion formed so as to be continued from said parallel portion, and a linear portion extending from said curve portion to a pointed end of said pin contact so as to be continued from said curve portion;

said curve portion being formed of a curve which is moderate in inclination in an area of a boundary point between said curve portion and said parallel portion and sharper in inclination in an area of a point at which said curve portion first touches said contact spring portion;

said linear portion being formed of a straight line inclined at an arbitrary constant inclination angle; and wherein a total insertion force of said large number of pin contacts into said large number of socket contacts increases linearly proportionally to a fitting depth of the respective pin contacts into the respective socket contacts while said linear portions of the respective pin contacts are touching said contact spring portions; and the total insertion force of said pin contacts is kept constant regardless of the fitting depth while the curve portion of each of said pin contacts is touching a corresponding one of said contact spring portions at a point beyond a boundary point between said linear portion and said curve portion.

9. An electric part according to claim 8, wherein said curve portion is formed of a curve represented by $$X = -\frac{Y}{\mu} + A\left(1 + \frac{1}{\mu^2}\right) \ln \frac{A}{|\mu Y - A|}$$

in which X is a distance in a direction parallel to said parallel portion by reference to a point at which said contact pin first touches said contact spring portion, Y is a distance in a direction perpendicular to said parallel portion by reference to said point, $\mu$ is a dynamic friction coefficient between said contact spring portion and said parallel portion, and A is a constant.

10. An electric part according to claim 8, wherein said linear portion is formed by replacing a region where $\theta_0 < dX/dY$ is satisfied in said curve by a line which has an arbitrary constant inclination angle $\theta_0$ with respect to a X axis taken in a direction parallel to said parallel portion and which is extended up to a center of said pin contact.

* * * * *

UNITED STATES PATENT AND TRADEMARK OFFICE
CERTIFICATE OF CORRECTION

PATENT NO. : 5,888,106                    Page 1 of 3
DATED      : March 30, 1999
INVENTOR(S): T. Ono, et al It is certified that error appears in the above-indentified patent and that said Letters Patent is hereby corrected as shown below:

Column 3, line 61, change "$\theta_0 < dX/dY$" to --$\theta_0 < \tan^{-1}(dY/dX)$--.

Column 5, line 30, change "$\theta_0 < dX/dY$" to --$\theta_0 < \tan^{-1}(dY/dX)$--; and line 35, change "$dX/dY = \theta_0$" to --$\tan^{-1}(dY/dX) = \theta_0$--.

Column 6, line 36, change "$\theta_0 < dX/dY$" to --$\theta_0 < \tan^{-1}(dY/dX)$--;

line 44, change "$\theta_0 < dX/dY$" to --$\theta_0 < \tan^{-1}(dY/dX)$--; and line 45, change "$\theta_0 < dX/dY$" to --$\theta_0 < \tan^{-1}(dY/dX)$--.

Column 7, lines 14 and 15, change "$dX/dY = 30°$" to --$\tan^{-1}(dY/dX) = 30°$--.

Column 10, line 2, change "$\theta_1 < dX/dY$" to --$\theta_1 < \tan^{-1}(dY/dX)$--;

line 3, change "$dX/dY$" to --$dY/dX$--; and lines 7 and 8, line 4, change "$dX/dY = \theta_1$" to --$\tan^{-1}(dY/dX) = \theta_1$--.

UNITED STATES PATENT AND TRADEMARK OFFICE
CERTIFICATE OF CORRECTION

PATENT NO.   : 5,888,106
DATED        : March 30, 1999
INVENTOR(S)  : T. Ono, et al It is certified that error appears in the above-indentified patent and that said Letters Patent is hereby corrected as shown below:

IN THE CLAIMS

Please amend claims 3, 7 and 10 as set forth below.

Column 12, Claim 3: A pin contact according to Claim 2, wherein
said linear portion is formed by replacing a region where [$\theta_0$ < dX/dY] $\underline{\theta_0 < \tan^{-1} (dY/dX)}$ is satisfied in said curve by a line which has an arbitrary constant inclination angle $\theta_0$ with respect to a X axis taken in a direction parallel to said parallel portion and which is extended up to a center of said pin contact.

Column 12, Claim 7: A connector according to Claim 6, wherein
said first linear portion is formed by replacing a region where [$\theta_0$ < dX/dY] $\underline{\theta_0 < \tan^{-1} (dY/dX)}$ is satisfied in said curve by a line which has an arbitrary constant inclination angle $\theta_0$ with respect to X axis taken in a direction parallel to said parallel portion and which is extended up to a center of said pin contact.

UNITED STATES PATENT AND TRADEMARK OFFICE
CERTIFICATE OF CORRECTION

PATENT NO. : 5,888,106
DATED : March 30, 1999
INVENTOR(S) : T. Ono, et al

It is certified that error appears in the above-indentified patent and that said Letters Patent is hereby corrected as shown below:

Column 14, Claim 10: An electric part according to Claim 18, wherein said linear portion is formed by replacing a region where [$\theta_0$ < dX/dY] $\underline{\theta_0 < \tan^{-1}(dY/dX)}$ is satisfied in said curve by a line which has an arbitrary constant inclination angle $\theta_0$ with respect to a X axis taken in a direction parallel to said parallel portion and which is extended up to a center of said pin contact.

Signed and Sealed this

Twelfth Day of October, 1999

Attest:

Attesting Officer

Q. TODD DICKINSON

Acting Commissioner of Patents and Trademarks